(12) United States Patent
Yoshimoto et al.

(10) Patent No.: US 6,373,167 B1
(45) Date of Patent: Apr. 16, 2002

(54) SURFACE ACOUSTIC WAVE FILTER

(75) Inventors: Susumu Yoshimoto; Yasushi Yamamoto, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/706,745

(22) Filed: Nov. 7, 2000

(30) Foreign Application Priority Data

Nov. 9, 1999 (JP) ............................................ 11-318105

(51) Int. Cl.$^7$ .............................. H01L 41/04; H03H 9/00
(52) U.S. Cl. .................... 310/313 D; 310/367; 333/195
(58) Field of Search .............................. 310/311, 313 R, 310/313 A, 313 B, 313 D, 367; 333/193, 195

(56) References Cited

U.S. PATENT DOCUMENTS

| | | | | |
|---|---|---|---|---|
| 4,263,571 A | * | 4/1981 | Kinoshita et al. ........... | 333/154 |
| 4,703,290 A | * | 10/1987 | Zibis et al. ............. | 310/313 B |
| 4,774,482 A | * | 9/1988 | Fleischmann .......... | 310/313 B |
| 5,184,042 A | * | 2/1993 | Kadota et al. .......... | 310/313 A |
| 6,023,122 A | * | 2/2000 | Liu et al. ................. | 310/313 B |
| 6,147,574 A | * | 11/2000 | Kidoh .................... | 310/138 B |

FOREIGN PATENT DOCUMENTS

| | | |
|---|---|---|
| JP | 2-28125 | 2/1990 |
| JP | 5-501486 | 3/1993 |
| JP | 9-69751 | 3/1997 |
| JP | 11-150442 | 6/1999 |

* cited by examiner

*Primary Examiner*—Georgia Epps
*Assistant Examiner*—Evelyn A. Lester
(74) *Attorney, Agent, or Firm*—Whitham, Curtis, Christofferson, P.C.

(57) ABSTRACT

The present invention disclosed a SAW filter in which unnecessary space on a chip can be reduced in comparison with the prior art, and in which a smaller chip can be realized. Because oblique step shaped reflection surfaces are provided in order to reflect the SAW, a smaller SAW filter than that used in the prior art can be realized.

7 Claims, 6 Drawing Sheets

SURFACE ACOUSTIC WAVE FILTER

BACKGROUND OF THE INVENTION

1. Field of the Invention

This invention relates to a surface acoustic wave filter comprising at least one comb shaped interdigital electrode mounted on a piezoelectric substrate, particularly a surface acoustic wave device which can be made smaller along the direction of propagation of surface acoustic waves than that of the prior art.

This application is based on Japanese Patent Application No. Hei 11-318105, the contents of which are incorporated herein by reference.

2. Background Art

Conventionally, in a surface acoustic wave (referred to as "SAW" hereinafter) filter, because the input and output comb shaped interdigital electrodes (referred to as "IDT" hereinafter) face each other, the dimension along the direction of propagation of surface acoustic waves must be larger than the sum of the lengths of the input and output IDTs, and miniaturization of the SAW filter is restricted. FIG. 4 shows an example of the configuration of a transversal (or transmission) SAW filter of the prior art. In this configuration, the size along the left and right direction of a chip 21, that is, the direction of propagation of surface acoustic waves, is inevitably larger than the sum of the lengths of the input IDT 22 and the output IDT 23, and therefore the miniaturization of the chip is restricted.

In another prior art there is a design for miniaturizing a chip by reflecting surface acoustic waves obliquely by means of an oblique metal grating reflector. FIG. 5 shows a prior art Published Japanese translation No. Hei 5-501486 of PCT International Publication in which oblique metal grating reflectors 34 and 35 are mounted on a transversal SAW filter to reflect a SAW. In this configuration, the dimension along the left and right direction of the chip (direction of propagation of the SAW) can be reduced by the way in which the SAW is reflected. However, because the absolute value of the reflection coefficient of a metal reflector is generally very small, many metal reflectors are usually necessary to achieve a sufficient amount of reflection, and as a result the miniaturization of the chip is restricted. In this configuration, when the number of oblique metal grating reflectors is reduced in order to miniaturize the chip, a problem results in which there is a large loss in reflection. On the other hand, there is also a problem in that when there is a large number of oblique metal grating reflectors, the chip's dimensions must be large.

In another prior art, a cut surface of a chip is used as a reflection edge surface in a resonator type SAW filter. In FIG. 6, the reflection of a SAW from reflection surfaces 43 and 44, which are cut surfaces of the left and right edges of a chip, is utilized and standing waves are formed along the direction of the arrows in the figure, such that the SAW filter functions as one port resonator. In this configuration, a required condition to form a resonator is that the SAW incident on the reflection surface 43 and the SAW required must be in phase. However, in order to put them in phase, the distance between the reflection surface (cut surface) and an electrode 42 must be formed with very high precision (at the micrometer level), resulting in the problem that the chip is difficult to produce.

The purpose of the present invention is to provide a SAW filter in which a transversal type IDT, which does not resonate in response to the response the generation and reception of a SAW, is used, and in which it is not necessary that the distance between a reflection edge surface and an electrode be formed with very high precision; therefore the formation of a reflection surface is simple, unused regions on a chip can be reduced in comparison with the prior art, and a SAW filter, provided with a small chip which is a constituent element of a SAW device, can be manufactured

SUMMARY OF THE INVENTION

A transversal type surface acoustic wave filter as claimed in claim1 comprises: an input interdigital transducer (IDT), which is comprised of a pair of comb electrodes whose respective electrode fingers are interdigitally formed; substrate boundary surfaces which formed at an angle to a wave front of a propagating surface acoustic wave generated in said input IDT; an output IDT, which is comprised of a pair of comb electrodes whose respective electrode fingers are interdigitally formed; wherein said input and output IDTs and said substrate boundary surfaces are all formed on a piezoelectric substrate; and wherein said input and output IDTs are arranged in parallel and in close proximity to each other along the longitudinal direction of the electrode fingers of said IDTs, and are arranged such that the input and output sides of each IDT are oriented in a direction perpendicular to the longitudinal direction of said electrode fingers.

A transversal type surface acoustic wave filter as claimed in claim 2 is characterized in that said substrate boundary surfaces are step shaped, and the height of the step d of said step shaped substrate boundary surfaces is $\lambda<d<5\lambda$, where $\lambda$ is a wavelength of the SAW.

A transversal type surface acoustic wave filter as claimed in claim 3 is characterized in that said substrate boundary surfaces are formed at an angle of 45 degrees to the wave front of said surface acoustic wave, and said surface acoustic wave only has displacement components parallel to said substrate.

A transversal type surface acoustic wave filter as claimed in claim 4 is characterized in that said surface acoustic wave, which only has displacement components parallel to said substrate, is a BGS wave.

A transversal type surface acoustic wave filter as claimed in claim 5 is characterized in that said surface acoustic wave, which only has displacement components parallel to said substrate, is a LOVE wave.

A transversal type surface acoustic wave filter as claimed in claim 6 is characterized in that said surface acoustic wave, which only has displacement components parallel to said substrate, is an SH wave.

A transversal type surface acoustic wave filter as claimed in claim 7 is characterized in that said surface acoustic wave, which has only displacement components parallel to said substrate, is an SSBW.

DETAILED DESCRIPTION OF THE PREFERRED EMBODIMENTS

Hereinafter, several embodiments of the present invention are described with reference to the appended figures.

Figure 1:
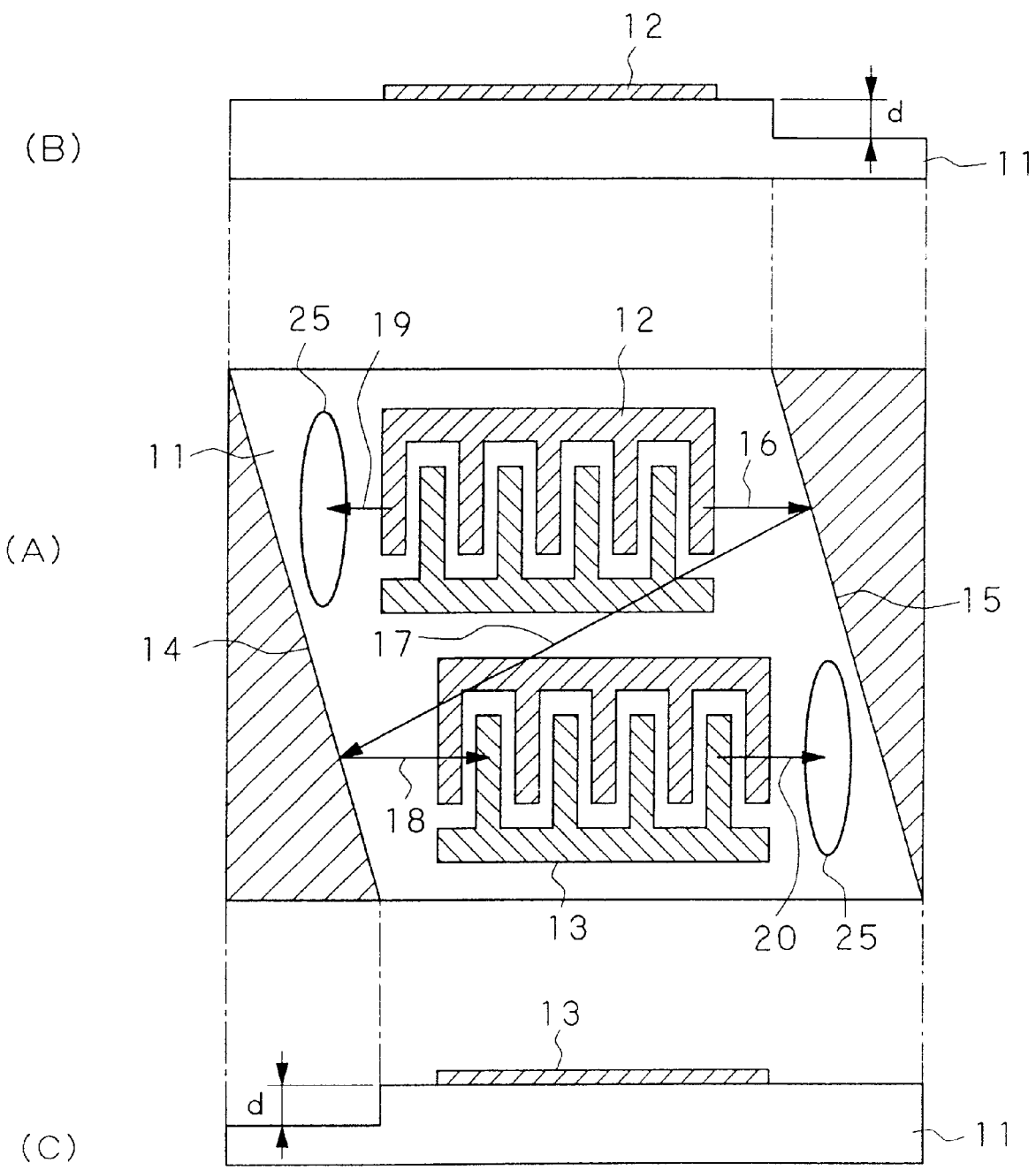
FIG. 1 shows a surface acoustic wave filter of a first embodiment of the present invention.

FIG. 1 shows a first example of a configuration of a SAW filter according to the present invention. A SAW generated by an input IDT 12 is reflected from an oblique reflection surface 15 which is a step formed on the right part of a chip 11 at an oblique angle to a wave front of the input SAW, propagates along an oblique angle on the chip, as shown by an arrow 17 in the figure, is reflected again from an oblique reflection surface 14 which is a step formed on the left part of the chip, and is received by an output IDT 13.

Next, the operation of the chip of the present invention is described in detail. FIG. 1 shows a transversal type SAW filter formed on a rectangular piezoelectric substrate according to the present invention. FIGS. 1(A), 1(B), and 1(C) are a top view, a side view as seen from the top portion of the figure, and a side view as seen from the bottom portion of the figure, respectively. A SAW generated by the input IDT 12 propagates in both directions 16 and 19 as shown in FIG. 1. A SAW propagating along the direction 16 is reflected from a step shaped reflection surface 15 which is formed at an oblique angle to the wave front of the input SAW on the right part of the chip and propagates along an oblique direction 17 on the chip. The SAW is then reflected again from a step shaped reflection surface 14 on the left part of the chip, which is formed parallel to the step shaped reflection surface 15, propagates along a direction 18 and is received by the output IDT 13. Because the propagating energy of the SAW is concentrated in a location within a few multiples of $\lambda$ from the substrate surface, a good value for the height of the step d is about $\lambda<d<5\lambda$, where $\lambda$ is a wavelength of the SAW. The reflection surfaces 14 and 15 can be formed by chemical processes such as etching or by machining processes such as dicing. Because SAWs propagating along the directions 19 and 20 are not wanted in the present embodiment, absorbing parts 25 are provided on the chip in order to attenuate the SAW.

Figure 4:
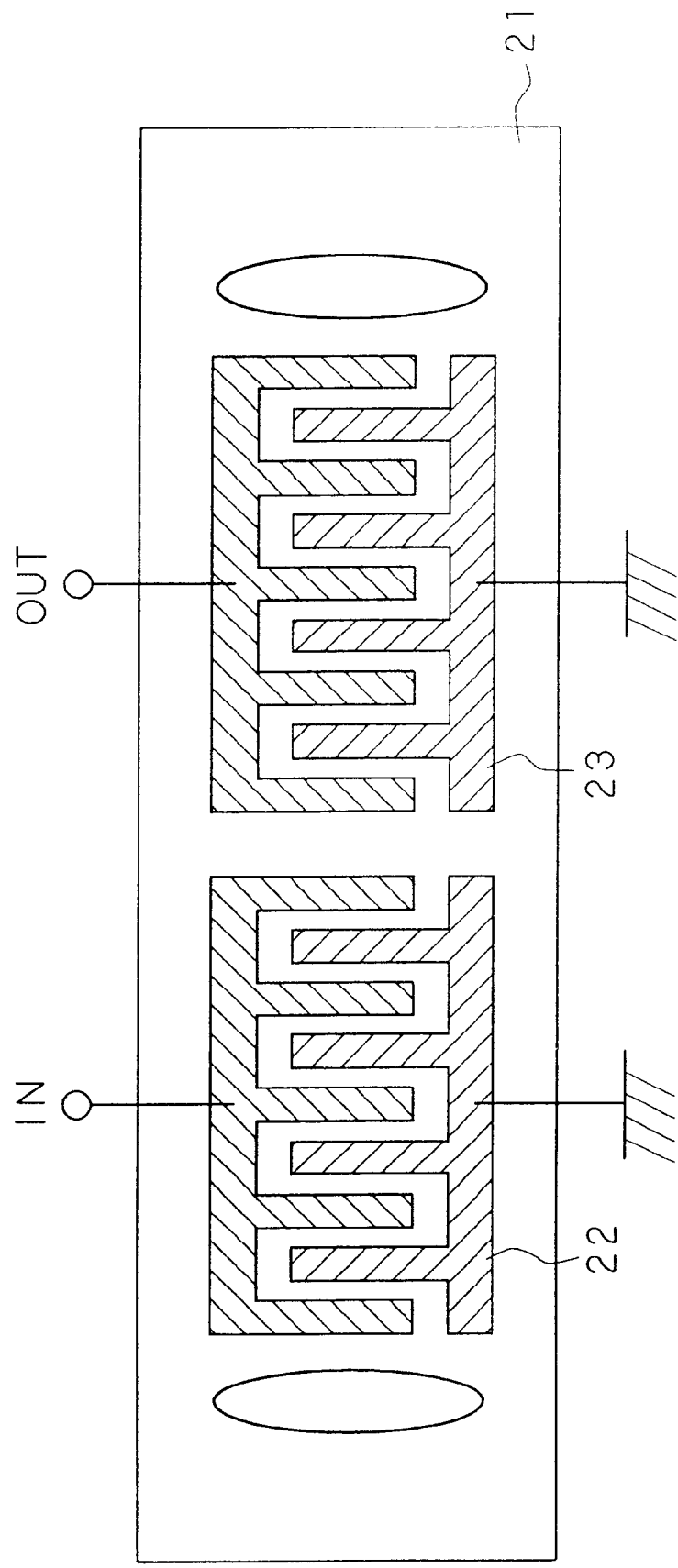
FIG. 4 shows a surface acoustic wave filter of a prior art.
Figure 5:
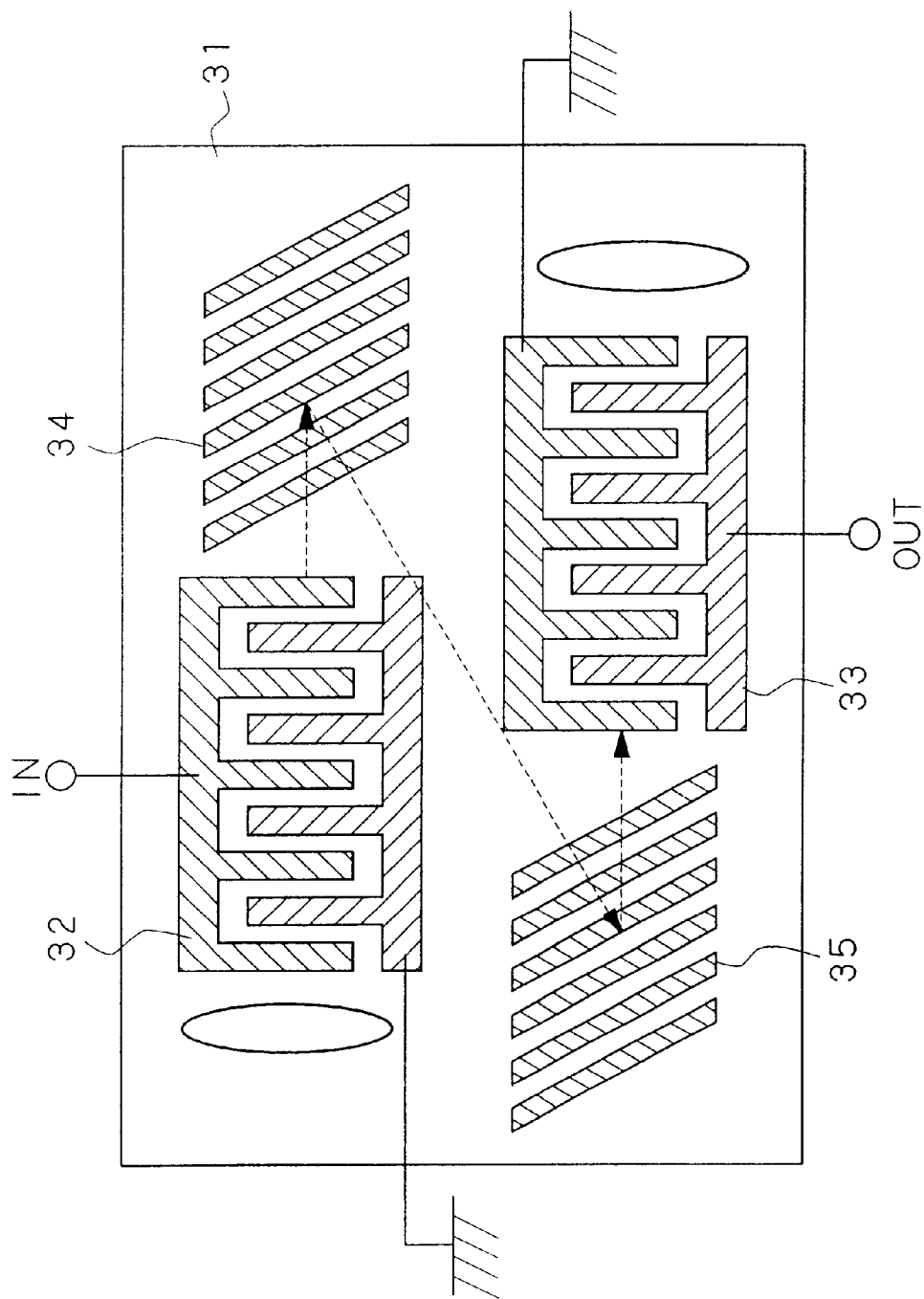
FIG. 5 shows a surface acoustic wave filter of a second prior art.
Figure 6:
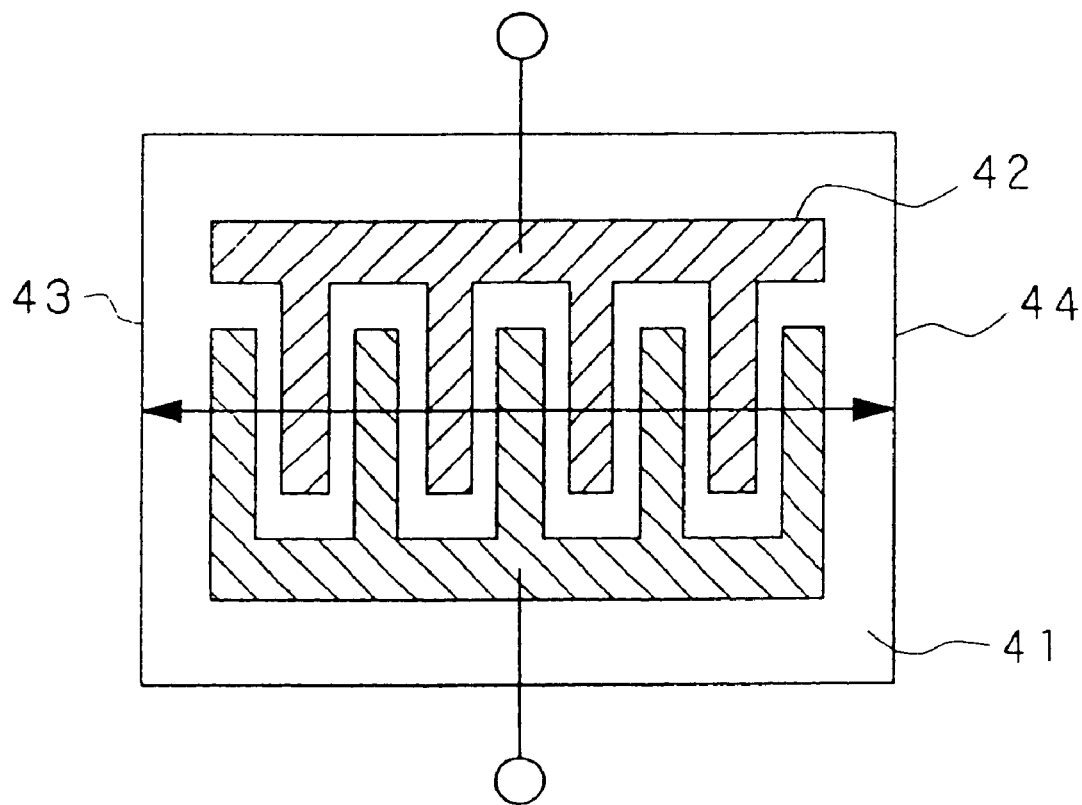
FIG. 6 shows a surface acoustic wave filter of a third prior art.

The loss in reflection at the concentrated and oblique step shaped reflection surfaces 14 and 15 of the present invention is lower than that of a distributed type reflector composed of an oblique metal grating of the prior art shown in FIG. 4. Because the reflection factor for each oblique metal grating is roughly a few percent in the prior art shown in FIG. 4, a large quantity of SAW energy penetrates the oblique metal reflector and leaks out when there is a small number of gratings, resulting in a large loss in reflection. Several tens or hundreds of gratings are necessary in order to reduce the loss in reflection, and as a result, miniaturization is restricted.

Figure 2:
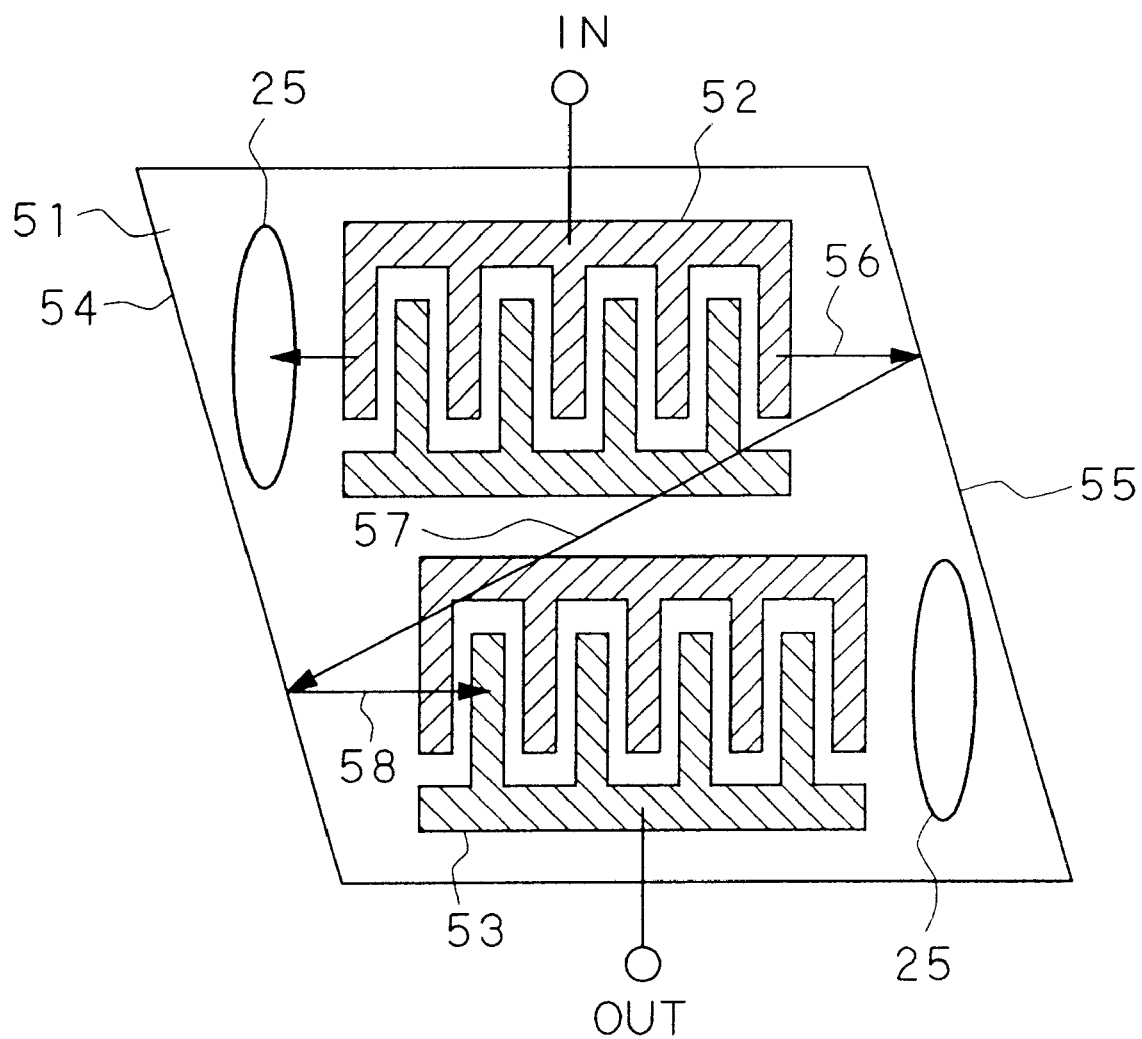
FIG. 2 shows a surface acoustic wave filter of a second embodiment of the present invention.

FIG. 2 shows a second embodiment of the present invention. Cut surfaces 54 and 55 of a chip are directly used as oblique reflection surfaces in the configuration of this second embodiment, while the oblique step shaped reflection surfaces are formed by chemically and mechanically machining a rectangular chip in the first embodiment shown in FIG. 1. In this second embodiment, it is possible to achieve a greater degree of miniaturization because unused regions on the chip are fewer than those of the first embodiment.

Figure 3:
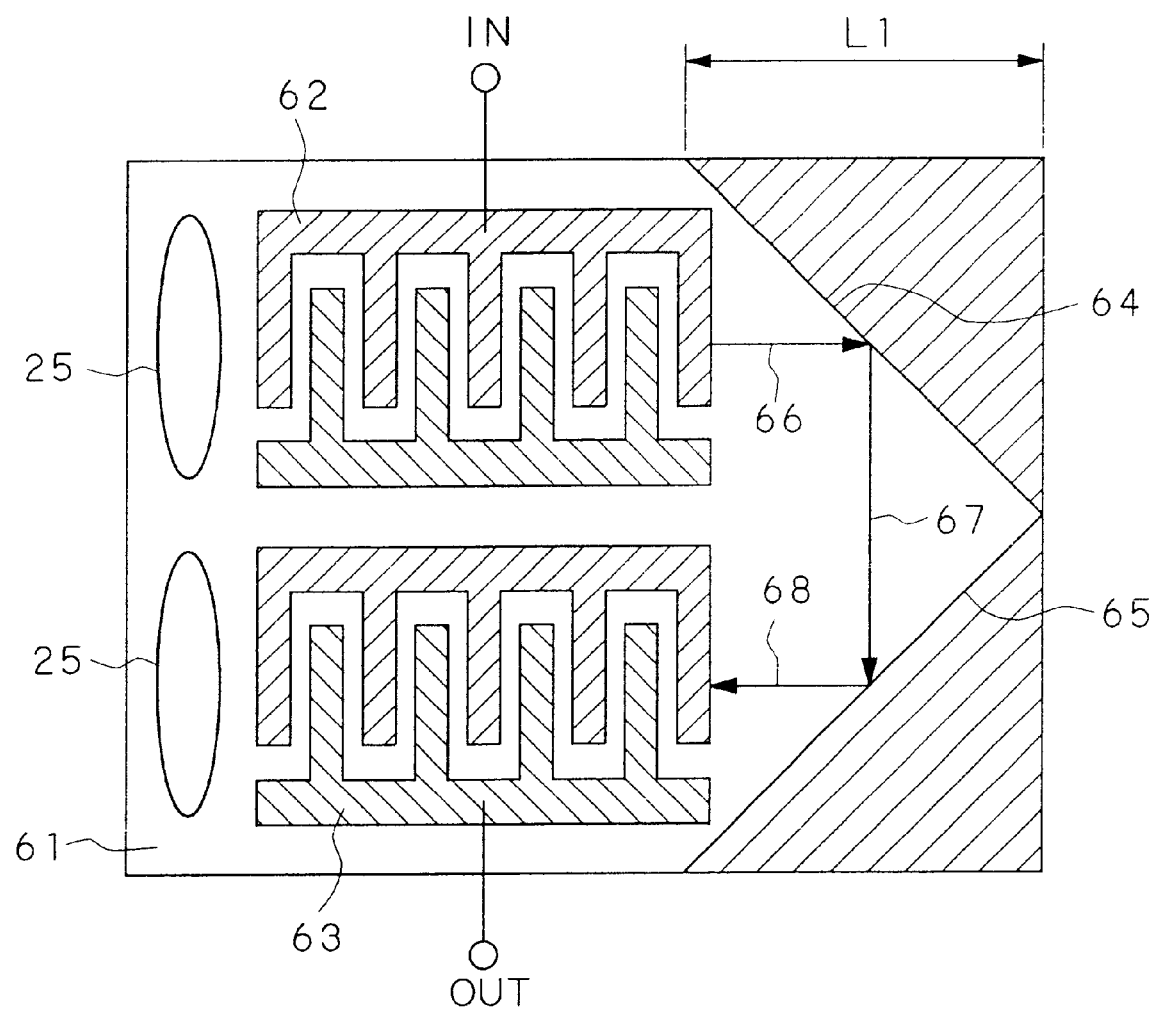
FIG. 3 shows a surface acoustic wave filter of a third embodiment of the present invention.

FIG. 3 shows a third embodiment of the present invention. As shown in FIG. 3, this embodiment is a SAW filter in which oblique step shaped reflection surfaces 64 and 65 are formed respectively at the upper and lower halves of one side of a chip (right side in the figure) oriented to the propagating SAW such that the SAW is incident on and reflects from the reflection surfaces at an angle of 45 degrees to the reflection surfaces and the SAW reflects with an angle of 90 degrees, and wherein SAW absorbing parts 25 are formed both at the side opposite the SAW output side 66 of an input IDT 62, and at the side opposite the SAW input side 68 of an output IDT 63. Because a dimension L1 along the left and right direction of the Tart which forms oblique step shaped reflection surfaces 64 and 65, is almost the same as the opening length of the input/output IDT (the width of the wave packet), miniaturization can be achieved by this configuration.

In this third embodiment, for the case where the exciting wave is a SAW, such as a BGS wave, a LOVE wave or the like, which only have components of displacement parallel to the substrate, or an SH wave or an SSBW (Surface Skimming Bulk Wave) which are bulk waves that can propagate on the surface of an elastic object to be received by a surface electrode, a mode transformation into longitudinal waves does not occur. For this reason, if these waves are propagated, a low-loss filter can be manufactured. For the case of an SH wave or an SSB wave, because the wave energy is not necessarily concentrated on the surfaces, a structure in which an edge is cut off, as shown in FIG. 2, is more appropriate for a reflection surface.

The waves described above can be generated using the substrates described below. For example, for a piezoelectric substrate, a BGS wave or an SH wave can be excited if the polarized axis of the substrate is selected so as to be parallel to the electrode finger of the IDT. For a quartz substrate, a BGS wave or an SSBW can be generated if a rotating Y substrate is selected. Particularly, if a quartz Y substrate with a cutting angle of 70 degrees is selected, a BGS wave can be strongly generated. A LOVE wave can propagate if an elastic film is formed in which a LOVE wave propagates at a slower speed than an SH wave.

A surface acoustic wave filter formed on a piezoelectric substrate according to the present invention has the following characteristics. Because an oblique step shaped reflection surface is provided in order to reflect the SAW, a smaller SAW filter than that used. in the prior art can be implemented. Because a concentrated-type total reflection surface is provided, a low-loss filter can be implemented more readily than the prior art provided with distributed-type oblique metal gratings. Because a SAW filter of the present invention is transversal-type, not resonator-type and therefore it is not necessary to form the reflection edge surface with high precision, it is easier to manufacture the SAW filter.

What is claimed is:

1. A transversal type surface acoustic wave filter comprising:
    an input interdigital transducer (IDT), which is comprised of a pair of comb electrodes whose respective electrode fingers are interdigitally formed;
    substrate boundary surfaces which formed at an angle to a wave front of a propagating surface acoustic wave generated in said input IDT;
    an output IDT, which is comprised of a pair of comb electrodes whose respective electrode fingers are interdigitally formed;
    wherein said input and output IDTs and said substrate boundary surfaces are all formed on a piezoelectric substrate;
    and wherein said input and output IDTs are arranged in parallel and in close proximity to each other along the longitudinal direction of the electrode fingers of said IDTs, and are arranged such that the input and output sides of each IDT are oriented in a direction perpendicular to the longitudinal direction of said electrode fingers.

2. A transversal type surface acoustic wave filter as claimed in claim 1, wherein said substrate boundary surfaces are step shaped, and the height of the step d of said step shaped substrate boundary surfaces is $\lambda<d<5\lambda$, where $\lambda$ is the wavelength of a SAW.

3. A transversal type surface acoustic wave filter as claimed in claim 1, wherein said substrate boundary surfaces are formed at an angle of 45 degrees to the wave front of said surface acoustic wave, and said surface acoustic wave only has displacement components parallel to said substrate.

4. A transversal type surface acoustic wave filter as claimed in claim 3, wherein said surface acoustic wave, which only has displacement components parallel to said substrate, is a BGS wave.

5. A transversal type surface acoustic wave filter as claimed in claim 3, wherein said surface acoustic wave, which only has displacement components parallel to said substrate, is a LOVE wave.

6. A transversal type surface acoustic wave filter as claimed in claim 3, wherein said surface acoustic wave, which only has displacement components parallel to said substrate, is an SH wave.

7. A transversal type surface acoustic wave filter as claimed in claim 3, wherein said surface acoustic wave, which only has displacement components parallel to said substrate, is an SSBW.

* * * * *